United States Patent [19]

Grabbe et al.

[11] Patent Number: 4,699,593
[45] Date of Patent: Oct. 13, 1987

[54] CONNECTOR HAVING CONTACT MODULES FOR A SUBSTRATE SUCH AS AN IC CHIP CARRIER

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 891,710

[22] Filed: Jul. 31, 1986

Related U.S. Application Data

[63] Continuation-in-part of Ser. No. 818,831, Jan. 14, 1986.

[51] Int. Cl.⁴ .............................................. H01R 23/72
[52] U.S. Cl. ...................................... 439/71; 439/680; 439/862
[58] Field of Search ........ 339/17 CF, 176 MP, 186 R, 339/186 M, 17 M, 252 R, 258 R, 258 P

[56] References Cited

U.S. PATENT DOCUMENTS

| | | | |
|---|---|---|---|
| 3,760,336 | 9/1973 | Cerwin .................... | 339/138 |
| 3,960,423 | 6/1976 | Weisenburger ............. | 339/17 CF |
| 4,093,330 | 6/1978 | Pittman ................... | 339/17 CF |
| 4,268,102 | 4/1981 | Grabbe .................... | 339/75 M |
| 4,354,729 | 10/1982 | Grabbe et al. .............. | 339/258 R |
| 4,395,084 | 7/1983 | Conrad .................... | 339/17 CF |
| 4,502,747 | 3/1985 | Bright et al. ............... | 339/75 M |
| 4,511,197 | 4/1985 | Grabbe et al. .............. | 339/17 CF |
| 4,513,353 | 4/1985 | Bakermans et al. .......... | 361/399 |
| 4,552,422 | 11/1985 | Bennett et al. .............. | 339/17 CF |
| 4,571,015 | 2/1986 | Mueller ................... | 339/17 CF |
| 4,593,463 | 6/1986 | Kamona et al. ............. | 29/884 |
| 4,647,124 | 3/1987 | Kandybowsky ............. | 339/17 CF |

OTHER PUBLICATIONS

IBM Bulletin, Dust, vol. 15, No. 1, p. 108, 6-1972.

*Primary Examiner*—Neil Abrams
*Attorney, Agent, or Firm*—Bruce J. Wolstoncroft; Frederick W. Raring

[57] ABSTRACT

Connector for a substrate such as an IC chip carrier comprises a housing assembly which in turn comprises a housing frame and a plurality of contact modules on the frame. Each module has a group of contact members therein. The contact members are located in predetermined positions in the frame and within predetermined dimensional tolerances. The housing frame and the substrate have substrate locating means for locating the substrate so that contact pads on the substrate will be in registry with the contact positions. Module locating means are also provided for locating the modules in the frame so that the contact members in the modules will be located in the predetermined positions. Each module has its own locating means which is directly related to the substrate locating means. The contact members in each module are thereby located within cumulative dimensional tolerances which are limited to the respective modules and are not cumulative beyond the individual modules.

14 Claims, 6 Drawing Figures

CONNECTOR HAVING CONTACT MODULES FOR A SUBSTRATE SUCH AS AN IC CHIP CARRIER

RELATIONSHIP TO OTHER COPENDING APPLICATIONS

This application is a Continuation-In-Part of U.S. Application Ser. No. 818,831 filed Jan. 14, 1986.

FIELD OF THE INVENTION

This invention relates to connectors, such as IC chip carrier sockets or similar substrates, for integrated circuit chip carriers and particularly to such connectors which have contact members contained in modules which are assembled to a connector frame or housing.

BACKGROUND OF THE INVENTION

Integrated circuits (ICs) and other electronic devices are commonly packaged in so-called IC chip carriers. A chip carrier comprises a body of insulating material having the IC chip contained therein and having contact pads at predetermined space locations near its periphery. The dimensions and other standards for such chip carriers are established in a specification, commonly referred to as the JEDEC standard which was established and which is maintained by the Electronics Industries Association of 2001 I Street, N.W., Washington D.C., 20006.

Connectors for integrated circuit chip carriers, such as chip carrier sockets or other types of connectors, must be manufactured so that the contact members in the connector housing will contact the pads in the integrated circuit chip carrier when the chip carrier is assembled to the connector housing. The connector thus must have some sort of a positioning means for locating the chip carrier on the connector, one such positioning means being shown in U.S. Application Ser. No. 818,831 filed Jan. 14, 1986 and comprising keys and keyways in the connector housing and in the chip carrier. Another known method of locating the chip carrier on the connector housing is to provide notches on three corners of the square chip carrier body, a beveled corner on the body, three locating pins on the connector housing, and a biasing spring on the housing.

Standard chip carriers are produced with varying numbers of contact pads or "postions" ranging from 64 positions to 164 positions or even more in proposed new designs. It can thus be appreciated that as the number of positions on the chip carrier increases, the difficulties in manufacturing the connector increase. The manufacturing difficulties encountered stem largely from the requirement that the contact members in the connector must all engage the contact pads in the chip carrier and when there are a high number of contact pads and therefore contact members in the connector, cumulative tolerance buildup problems become increasingly difficult to solve.

It is known to produce connectors for IC chip carriers in the form of a housing having a plurality of contact modules therein or thereon, each contact module comprising usually a length of insulating material having spaced-apart metallic contact terminals or other contact devices therein, see for example U.S. Pat. Nos. 3,960,423, 4,571,015, and 4,593,463. The use of contact modules offers several advantages such as the fact that different types of modules can be fitted into a standard housing frame so that a single type of frame can be used for an entire family of connectors such as chip carrier sockets. Additionally, the use of modules frequently will simplify the manufacturing process.

The manufacturing problems discussed above regarding cumulative tolerances in IC chip carrier connectors have heretofore discouraged the use of the module approach to connector manufacturing, particularly for the higher count chip carrier connectors such as those designed to accept chip carriers having 164 contact pads thereon. The difficulty of positioning the module on the connector housing with sufficient precision to enable the contact members in the module to engage the contact pads or positions on the chip carrier itself have largely been the cause of the limited use made of this modular approach in the past.

The present invention is directed to the achievement of an improved connector for an IC chip carrier or other substrate which contains a plurality of contact modules mounted in a frame and which has positioning means for the modules which permit the connector to accept chip carriers having relatively high numbers of contact positions thereon. The connector may be a conventional chip carrier socket or it may be of other types as will be described below.

THE INVENTION

An embodiment of the invention comprises a connector for a substrate having electronic device means thereon. The substrate comprises a body of insulating material having oppositely facing substrate major surfaces and outwardly facing peripheral substrate side surfaces. A plurality of contact pads or positions are provided on the substrate at spaced-apart locations. The connector comprises a connector housing assembly having a substrate receiving zone and a plurality of metallic contact members in the housing assembly in surrounding relationship to the receiving zone for contacting the contact pads. The connector is characterized in that the housing assembly comprises a housing frame and a plurality of contact modules mounted on the frame, each module having a group of contact members therein. The housing frame has oppositely facing first and second housing major surfaces and outwardly facing peripheral housing side surfaces. The substrate receiving zone is located on the first housing major surface. A plurality of modular receiving sites are provided on the first housing major surfaces in surrounding relationship to the substrate receiving zone and the modules are in the sites. The contact members are located in the housing assembly in predetermined positions in accordance with an industry standard and must be located within predetermined dimensional tolerance ranges for those limits. The housing frame and each of the individual modules have individual module locating means for locating each of the individual modules in positions which locate the individual contact members in the modules in the predetermined positions in the housing assembly. The housing frame and the substrate have substrate locating means for locating the substrate in the receiving zone with the contact pads of the substrate in registry with the precisely predetermined positions. Each individual module locating means is located with direct reference to the substrate locating means so that the contact members in each group (in each of the modules) are located in their predetermined position in the housing assembly within cumulative dimensional tolerances which are limited to the respective groups.

In accordance with one embodiment of the invention, the individual module locating means comprise module locating key means and module locating keyway means. The substrate locating means comprises a substrate locating key means and a substrate locating keyway means. In one embodiment, the module locating key means and the substrate locating key means is shared common key means.

THE DRAWING FIGURES

THE DISCLOSED EMBODIMENT

Figure 1:
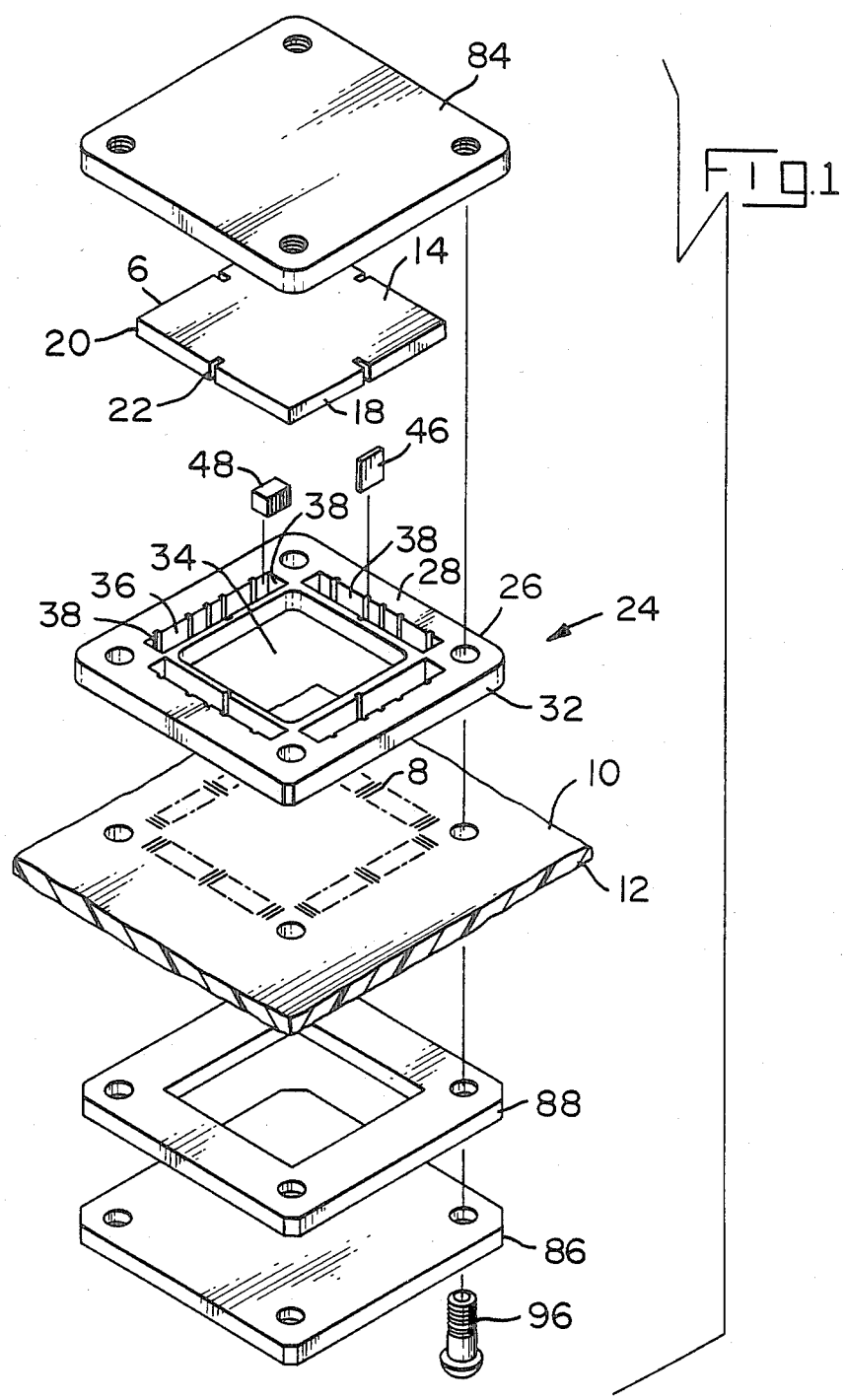
FIG. 1 is a perspective exploded view showing a connector in accordance with the invention and showing a substrate and a circuit board or other substrate in alignment with the connector.

Referring to FIGS. 1-4, a connector assembly 2 in accordance with the invention serves to connect contact pads 4 on a substrate 6 to terminal areas or pads 8 on one surface 10 of a panel-like member 12 which may be a circuit board or another device having a substrate. The substrate 6 comprises a square body of insulating material having an upper substrate surface 14, as viewed in the drawing, a lower substrate major surface 16, and peripheral substrate side surfaces 18 which intersect at corners 20. Keyway notches 22 extend into the peripheral substrate side surfaces 18 between each pair of adjacent corners 20.

The connector assembly 2 comprises a housing assembly 24 which in turn comprises a housing frame 26 in which there are contained a plurality of modules 48 described below. The housing frame has an upper housing major surface 28, a lower or second housing major surface 30, and peripherally extending housing side surfaces 32 which intersect at corners. A central portion of the upper surface 28 constitutes a substrate receiving zone 34 which is square and which includes, but extends beyond, a central opening in the housing frame. Module receiving openings 36 are provided between the central opening and the peripheral side surfaces 32. These module receiving opening 36 surround the substrate receiving zone 34 and in the disclosed embodiment four such openings 36 are provided, each opening extending along one of the sides of the square substrate receiving zone.

Figure 2:
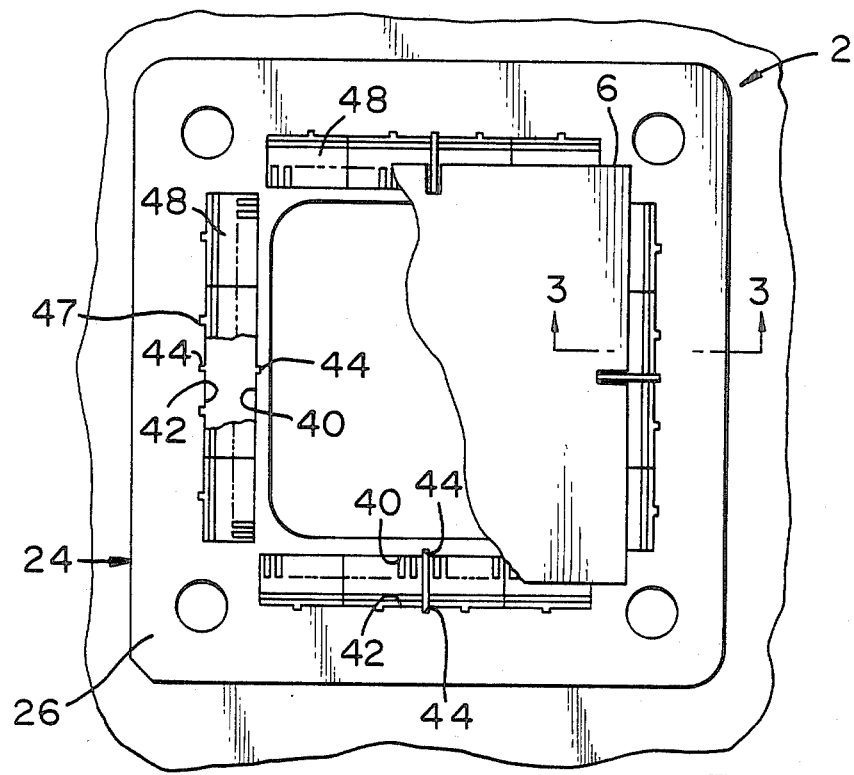
FIG. 2 is a top plan view, with parts broken away, showing the connector mounted on the circuit board or other lower substrate.

Each opening 36 has ends 38 that are adjacent to the corners of the frame and has inner and outer opening sidewalls 40, 42, the outer sidewall being adjacent to the peripheral surface 32 as shown in FIG. 2. Each opening has a pair of centrally located opposed keyways 44 for reception of a substrate positioning key 46 which is received in the notches 22 of the substrate. The keyways 44 are substantially midway between the ends 38 of the opening. Additional keyways 47 are provided in the sidewall 42 and are between the keyways 44 and one of the ends 38.

Figure 5:
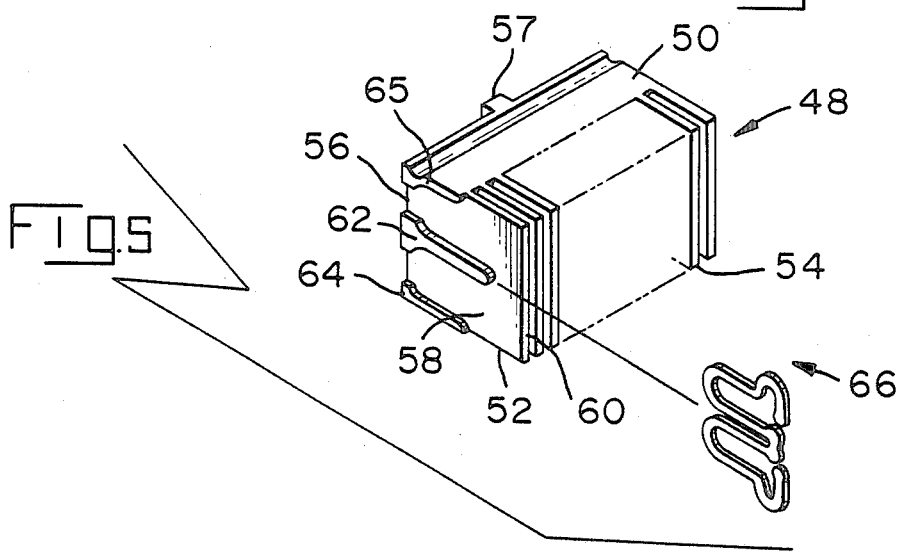
FIG. 5 is a perspective view showing an individual contact module with one contact member exploded from the module.

Referring now to FIG. 5, each of the modules 48 comprises a block of insulating material, preferably, a molded plastic material, having upper and lower major surfaces 50, 52 as viewed in the drawing, inner and outer side surfaces 54, 56, and ends 58. Each module has a module key 57 integral with its side surface 56 which is dimensioned to be received in one of the module keyways 47, thereby accurately to locate the module in its respective module receiving opening. A plurality of contact receiving cavities 60 extend inwardly of each module from the side surface 54 and extend to the upper and lower surfaces 50, 52. Each cavity also extends completely through the module to the surface 56 and has a central positioning rib 62 which extends from the surface 56 towards the surface 54. Upper and lower positioning ribs are also provided as shown at 64 and 65. These positioning ribs accurately locate the contact members 66 in the cavities.

Figure 3:
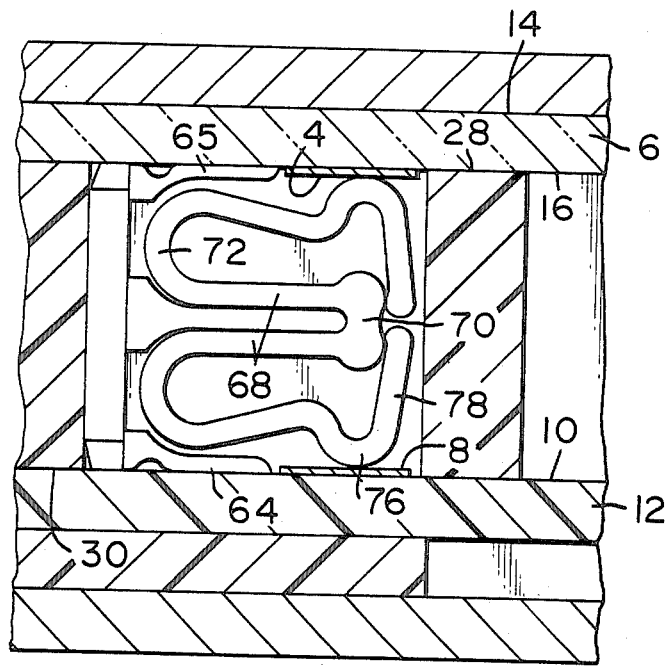
FIG. 3 is a sectional view looking in the direction of the arrows 3—3 of FIG. 2.
Figure 4:
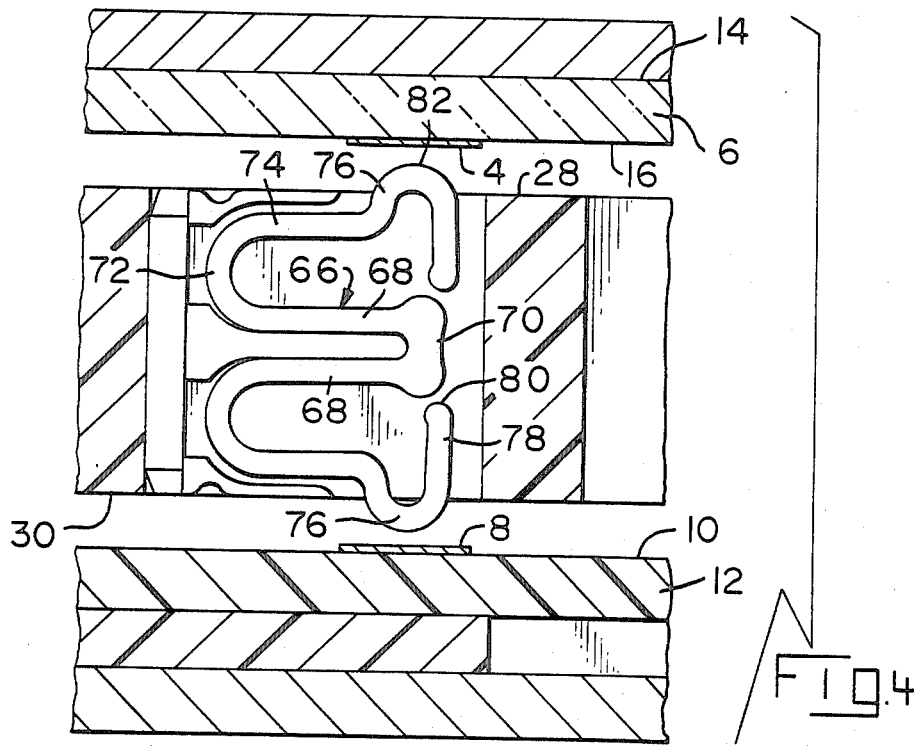
FIG. 4 is a view similar to FIG. 3 but showing the parts exploded from each other.

The contact members 66 provide an electrical path downwardly as viewed in FIGS. 3 and 4 from the terminal pads 4 on the upper substrate to the terminal pads 8 on the panel-like member 12. The contact members are flat stamped sheet metal devices having a pair of parallel central or inner arms 68 connected by a bight portion 70. The left-hand ends of the arms as viewed in FIG. 4 are curved as shown at 72, thereby to provide upper arms 74 which are adjacent to the upper and lower surfaces of the housing frame. Adjacent to their ends, the arms 74 extend laterally as shown at 76 to a contact portion 82 and then inwardly as shown at 78 to their ends 80. The ends are also contact portions in that they bear against the bight portion 70 so that the electrical path extends from the upper contact portion 82 to the bight portion and then through the lower arm portion 78 to the lower contact portion. The arms 68 and 74 thus function as spring members rather than as conductors and determine the contact pressure at the various electrical interfaces at 82 and 80 as viewed in FIG. 3. It should be mentioned that an extremely short electrical path is desirable for high speed (high frequency) devices in order to avoid inductance effects.

As shown best in FIGS. 1 and 3, the particular embodiment of the invention disclosed has upper and lower pressure plates 84, 86 which are preferably of metal and a lower insulator plate 88 which is interposed between the lower pressure plate 86 and the underside of the panel-like member 12. The entire assembly is held in position by means 90 (FIG. 1) which extend through the entire assembly and which are received in threaded holes in the upper pressure plate 84. As will be apparent from a comparison of FIGS. 3 and 4, when the screws are tightened, the individual contact members are flexed and the contact portions 82 are urged against the pads 4, 8, and the ends of the arms 78 are urged against edge portions of the bight 70.

A salient advantage of the invention is that a wide variety of connectors can be produced at greatly reduced tooling cost for the reason that a variety of modules 48 can be used with a standard housing frame 24. For example, the standard frame 24 can be used with modules having different numbers of contact members in each module and with different center-to-center spacings of the contact members in each module. Additionally, the modules might have different types of terminals without necessitating manufacture of an entirely different housing for the terminal. It can be appreciated that the tooling cost (the cost to produce the mold) to manufacture a connector housing is quite high and the larger the number of contact members in the housing, or to put it another way, the higher the density of the contact members, the greater the cost of tooling. The connector shown in the accompanying drawings is, in fact, designed to have 320 contact positions therein or 80 contact positions along each of the sides of the square substrate receiving zone 34. The standard overall dimensions of connectors of this type are about 1.45 inches on each side of the substrate receiving zone has 80 contact members on very closely spaced centers. In the practice of the present invention, it is only necessary to produce a mold to manufacture a single module as shown at 48 having 20 cavities therein for contact members 66. The individual modules are then assembled to the frame as described above. By prior art methods, on the other hand, it would be necessary to produce a mold for a housing member having 320 cavities therein. It should be mentioned that an added advantage is achieved in many instances by virtue of the fact that the cavities are produced in the individual modules rather than in the frame housing and the tooling problems are thereby greatly simplified. It can be seen that the individual cavities in the module of FIG. 5 can be molded with straight action type injection molding material. If it were attempted to produce cavities of the same configuration directly in the housing frame, the molding operation would be rendered must more difficult.

The advantages discussed above are achieved, as a practical matter, by virtue of the fact that the module locating means of the connector for locating the individual modules in the housing frame, and the substrate locating means, for locating the substrate on the housing frame, are directly related to each other and the usual problems encountered with tolerance buildup in the manufacture of connectors are greatly alleviated. The module locating and substrate locating systems for the connector are interrelated in the sense that the keyways 44, which locate the substrate on the housing frame and the keyways 47, which locate the modules in the housing frame, are determined from a common reference point when the housing frame is manufactured. The parts which are assembled to the housing frame, the modules 48 and the substrate 6, are thus brought into registry with each other by the commonality of the locating or keying systems which locate these parts on the frame.

The importance of the interrelated keying systems discussed above can be appreciated from a consideration of the problems which are always encountered in the manufacture of connectors of the type under consideration with reference to the location of the contact receiving cavities. In general, the cavities in a connector housing cannot be exactly positioned or located but can only be located in the housing within dimensional tolerances; for example, the center-to-center spacing between adjacent cavities in a housing might be 0.02 inches plus or minus about 0.004 inches. The variations due to this tolerance are not always self-cancelling and for this reason, designers commonly specify a cumulative tolerance which is to say they specify a limitation on the tolerance buildup should all of the variations from the nominal dimension be on the plus side rather than on the minus side. Cumulative tolerances are virtually uncontrollable when the number of units, in this case contact receiving cavities, grows relatively large. Thus the disclosed embodiment of the invention, since it has 80 contact receiving cavities along each side of the substrate receiving zone would have a very large cumulative tolerance buildup in each of the sections of 80 contact members.

In accordance with the principles of the present invention, however, the contact members are handled in small groups and the maximum cumulative tolerance buildup is limited to the cumulative buildup of that group. In the disclosed embodiment, each module has 20 cavities and the maximum cumulative tolerance buildup is therefore limited by that number.

Figure 6:
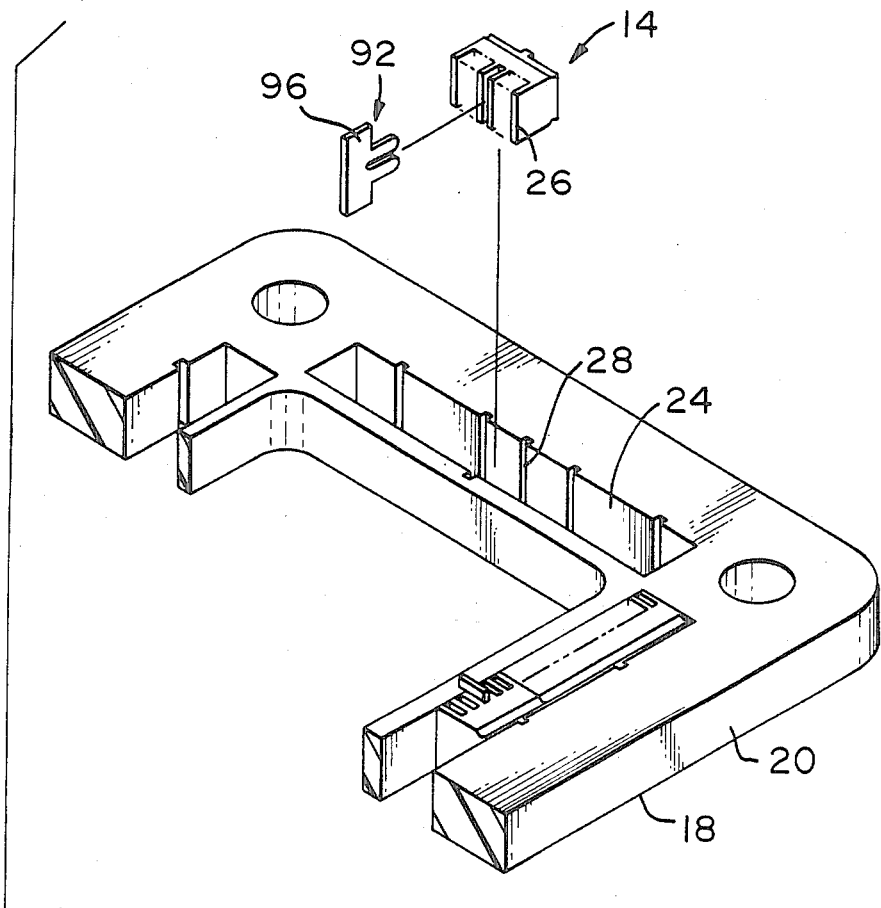
FIG. 6 is a perspective view showing an alternative embodiment.

FIG. 6 shows an alternative embodiment of the invention which is generally similar to the embodiment of FIGS. 1–5 but differs therefrom in that the locating system for the modules and the locating system for the substrate 4 have a shared common keying member 92. In this instance, a module bridges or extends past each of the pairs of opposed keyways 44 and the common keying member 92 has arms such that it can extend into one of the cavities of the common module. The common keying member 92 thus has an upstanding ear 96 which is received in a notch 22 of the substrate.

The principles of the invention can be used in a wide variety of connectors used in the electronics industry. The connector disclosed might be classified as an interposer for the reason that its function is to connect pads on the underside of the substrate to contact surfaces on the upper surface of the panel member 12. The principles of the invention can also be used for chip carrier sockets of the various types commonly used, for example, sockets of the type in which a central well is provided in the housing for reception of chip carriers having contact pads on their peripheral side surfaces. In all instances, the economies achieved by the practice of the invention will be realized.

We claim:

1. A connector for a substrate having electronic device means thereon, the substrate comprising a body of insulating material having oppositely facing substrate major surfaces and outwardly facing peripheral substrate side surfaces, a plurality of contact pads at spaced-apart locations on the substrate, the connector comprising a connector housing assembly having a substrate receiving zone thereon and a plurality of metallic contact members in the housing assembly in surrounding relationship to the receiving zone for contacting the contact pads, the connector being characterized in that:

the housing assembly comprises a housing frame and a plurality of contact modules on the frame, each contact module having a group of contact members therein, the housing frame has oppositely facing first and second housing major surfaces and outwardly facing peripheral housing side surfaces, the substrate receiving zone being located on the first housing major surface, a plurality of module receiving sites are provided on the first housing major surface, the sites surrounding the substrate receiving zone, the modules being in the sites, the contact members are located in the housing assembly in predetermined positions and within predetermined dimensional tolerances, the housing frame and each of the individual modules having individual module locating means for locating each of the individual modules in positions which locate the individual contact members in the modules in the predetermined positions in the housing assembly, the housing frame and the substrate having substrate locating means for locating the substrate in the receiving zone with the contact pads in registry with the precisely predetermined positions, each individual module locating means being located between the substrate locating means and a respective end of each module receiving site, such that each individual module locating means is positioned in direct reference to the substrate locating means whereby, the contact members in each group are located in their predetermined positions in the housing assembly within cumulative dimensional tolerances which are limited to the respective groups.

2. A connector as set forth in claim 1 characterized in that each module receiving site has therein a plurality of individual modules in stacked end-to-end relationship.

3. A connector as set forth in claim 2 characterized in that the module locating means of each individual module comprises module locating key means and module locating keyway means, the substrate locating means comprising substrate locating key means and a substrate locating keyway means.

4. A connector as set forth in claim 3 characterized in that the substrate receiving zone is rectangular and four module receiving sites are provided, each module receiving site extending along one of the four sides of the substrate receiving zone.

5. A connector as set forth in claim 4 characterized in that the substrate locating key means and substrate locating keyway means comprises four substrate locating keys and four substrate locating keyways, each of the four sides of the substrate receiving zone having one substrate key and one substrate keyway associated therewith.

6. A connector as set forth in claim 5 characterized in that each of the module receiving sites has ends between which the modules are stacked, each of the module locating key means and module locating keyway means being between one of the ends of its respective site and the substrate key and substrate keyway of its respective site.

7. A connector as set forth in claim 6 characterized in that each of the module locating key means comprises a key which is integral with a module, each of the module locating keyway means comprises a module keyway in the housing frame.

8. A connector as set forth in claim 7 characterized in that the substrate locating key means comprises a plurality of substrate key members, the substrate locating keyway means comprises substrate keyways in the substrate and in the housing frame.

9. A connector as set forth in claim 3 characterized in that the module locating key means and the substrate locating key means is a shared common key means.

10. A connector as set forth in any one of claims 1, 3, 7 and 9 characterized in that each of the module sites comprises an opening extending through the housing, the modules being in the openings.

11. An electrical contact having substantially all of its parts lying in a single plane, the electrical contact comprising:

a first spring contact means and a second spring contact means;

a bight portion having a first end integral with the first spring contact means and a second end integral with the second spring contact means;

the first spring contact means having a spring portion, a contact portion, and a leg portion, the spring portion having a first end which is integral with the bight portion and a second end which is attached to the contact portion, the spring portion is configured in such a manner as to provide the spring characteristics required to ensure proper operation of the electrical contact, the contact portion extends from the spring portion such that the contact portion is positioned to effect electrical engagement with contact pads of a substrate or the like, the leg portion extends from the contact portion such that a free end of the leg portion is positioned proximate the bight portion;

the second spring contact means having a spring portion, a contact portion, and a leg portion, the spring portion having a first end which is integral with the bight portion and a second end which is attached to the contact portion, the spring portion is configured in such a manner as to provide the spring characteristics required to ensure proper operation of the electrical contact, the contact portion extends from the spring portion such that the contact portion is positioned to effect electrical engagement with contact pads of a substrate or the like, the leg portion extends from the contact portion such that a free end of the leg portion is positioned proximate the bight portion;

the free end of the leg portion of the first spring contact means and a first section of the bight portion are in overlapping relationship, as are the free end of the leg portion of the second spring contact means and a second section of the bight portion, whereby as the contact portions of the first and second spring contact means are brought into engagement with respective electrical components, the spring portions are resiliently depressed, causing the free ends of the leg portions to engage the corresponding sections of the bight portion, this motion results in a wiping action between the respective free ends of the leg portions and the bight portion, resulting in current flowing in a path from the first electrical component through the contact portion of the first spring contact means, the leg portion of the first spring contact means, the bight portion, the leg portion of the second spring contact means, the contact portion of the second spring contact means, and to the second electrical component.

12. An electrical contact as recited in claim 11 wherein the spring portions of the first spring contact means and the second spring contact means are of a generally U-shaped configuration.

13. An electrical contact as recited in claim 11 wherein the free ends of the leg portions of the first spring contact means and the second spring contact means have an arcuate configuration.

14. An electrical contact as recite in claim 11 wherein the first spring contact means is essentially a mirror image of the second spring contact means.

* * * * *